(12) United States Patent
Lee et al.

(10) Patent No.: US 12,331,872 B2
(45) Date of Patent: Jun. 17, 2025

(54) DISPLAY APPARATUS

(71) Applicant: SAMSUNG ELECTRONICS CO., LTD., Suwon-si (KR)

(72) Inventors: Jaeneung Lee, Suwon-si (KR); Chulyong Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 18/133,649

(22) Filed: Apr. 12, 2023

(65) Prior Publication Data

US 2023/0417360 A1 Dec. 28, 2023

Related U.S. Application Data

(63) Continuation of application No. PCT/KR2023/003973, filed on Mar. 24, 2023.

(30) Foreign Application Priority Data

Jun. 24, 2022 (KR) .................. 10-2022-0077851

(51) Int. Cl.
*H05K 5/02* (2006.01)
*F16M 11/04* (2006.01)
(Continued)

(52) U.S. Cl.
CPC .......... *F16M 11/105* (2013.01); *F16M 11/041* (2013.01); *H05K 5/0217* (2013.01); *F16M 11/22* (2013.01); *F16M 2200/024* (2013.01)

(58) Field of Classification Search
CPC .... F16M 11/105; F16M 11/041; F16M 11/22; F16M 2200/024; F16M 11/06;
(Continued)

(56) References Cited

U.S. PATENT DOCUMENTS

| | | | |
|---|---|---|---|
| 6,443,408 B1 * | 9/2002 | Hung | F16M 11/2021 |
| | | | 248/176.1 |
| 10,206,522 B2 | 2/2019 | Yang et al. | |

(Continued)

FOREIGN PATENT DOCUMENTS

| | | |
|---|---|---|
| CN | 104421584 B | 3/2016 |
| CN | 111207282 A | 5/2020 |

(Continued)

OTHER PUBLICATIONS

International Search Report dated Jul. 13, 2023 for International Application No. PCT/KR2023/003973.

(Continued)

*Primary Examiner* — Anthony M Haughton
*Assistant Examiner* — Hung Q Dang
(74) *Attorney, Agent, or Firm* — STAAS & HALSEY LLP

(57) ABSTRACT

A display apparatus including a support bracket including a coupling groove on a rear surface of a display module, a locking link movable from outside of the coupling groove to inside of the coupling groove, and from inside of the coupling groove to outside of the coupling groove, and a rotating link; and a support module, including a magnet, being lockable to, and unlockable from, the support bracket, wherein the support module is insertable in the coupling groove so that the magnet moves the locking link from outside to inside of the coupling groove to contact the support module and lock the support module to the support bracket, and when the rotating link is rotated while the support module is locked to the support bracket, the rotating link moves the locking link from inside to outside of the coupling groove and unlocks the support module from the support bracket.

15 Claims, 14 Drawing Sheets

(51) Int. Cl.
*F16M 11/10* (2006.01)
*F16M 11/22* (2006.01)

(58) Field of Classification Search
CPC ............... F16M 2200/02; F16M 11/16; F16M 2200/021; H05K 5/0217
See application file for complete search history.

(56) References Cited

U.S. PATENT DOCUMENTS

| | | | |
|---|---|---|---|
| 10,798,830 | B2 | 10/2020 | Hwang et al. |
| 11,246,233 | B2 | 2/2022 | Venkatesh et al. |
| 11,262,021 | B2 | 3/2022 | Daugirdas et al. |
| 11,395,548 | B2 | 7/2022 | Yoon et al. |
| 11,519,548 | B2 * | 12/2022 | Hsu .................. F16M 11/041 |
| 11,672,089 | B2 * | 6/2023 | Lee .................. F16M 11/041 361/807 |
| 11,744,027 | B2 * | 8/2023 | Hsu .................. F16M 11/041 361/807 |
| 12,156,355 | B2 * | 11/2024 | Chang .................. F16M 11/041 |
| 2007/0139871 | A1 | 6/2007 | Chiu |
| 2013/0000084 | A1 | 1/2013 | Nassar |
| 2013/0303000 | A1 | 11/2013 | Witter et al. |
| 2020/0081483 | A1 | 3/2020 | Laurent et al. |
| 2020/0084902 | A1 | 3/2020 | Venkatesh et al. |
| 2022/0003355 | A1 | 1/2022 | Hsu |
| 2022/0095466 | A1 | 3/2022 | Lee |

FOREIGN PATENT DOCUMENTS

| | | |
|---|---|---|
| JP | 2014-523496 A | 9/2014 |
| KR | 20-2011-0002867 | 3/2011 |
| KR | 10-2011-0070019 A | 6/2011 |
| KR | 10-2016-0113163 A | 9/2016 |
| KR | 10-2703396 B1 | 2/2020 |
| KR | 10-2021-0031286 A | 3/2021 |
| KR | 10-2291192 B1 | 8/2021 |
| WO | WO 2018/236376 A1 | 12/2018 |

OTHER PUBLICATIONS

Written Opinion of the International Searching Authority dated Jul. 13, 2023 for International Application No. PCT/KR2023/003973.
Extended European Search Report dated Mar. 20, 2025 for European Application No. 23827329.6.

* cited by examiner

DISPLAY APPARATUS

CROSS-REFERENCE TO RELATED APPLICATION

This application is a continuation of International Application PCT/KR2023/003973, filed Mar. 24, 2023, and is based on and claims priority under 35 U.S.C. § 119 to Korean Patent Application No. 10-2022-0077851, filed on Jun. 24, 2022 in the Korean Intellectual Property Office, the disclosure of which is incorporated by reference herein in its entirety.

BACKGROUND

1. Field

The disclosure relates to a display module, and a display apparatus including a support module that rotatably supports the display module and is detachable from the display module.

2. Description of the Related Art

A display apparatus is a kind of output apparatus that converts acquired or stored electrical information into visual information to display the visual information for users.

The display apparatus includes a self-emissive display panel such as Organic Light Emitting Diodes (OLEDs) or a non-emissive display panel such as a Liquid Crystal Display (LCD).

The display apparatus includes a display module including the display panel and displaying images, and a stand supporting the display module.

SUMMARY

Aspects of embodiments of the disclosure will be set forth in part in the description which follows and, in part, will be apparent from the description, or may be learned by practice of the presented embodiments.

In accordance with an aspect of the disclosure, a display apparatus includes: a display module; a support bracket including a coupling groove provided on a rear surface of the display module, a locking link configured to be movable from outside of the coupling groove toward inside of the coupling groove, and a rotating link configured to move the locking link to the outside of the coupling groove; and a support module configured to be locked to the support bracket by being inserted in the coupling groove, and unlocked from the support bracket by rotating the rotating link, the support module including a magnet providing a magnetic force to move the locking link to the inside of the coupling groove.

According to an embodiment of the disclosure, a display apparatus may include a display module; a support bracket including a coupling groove on a rear surface of the display module, a locking link configured to be movable from outside of the coupling groove to inside of the coupling groove, and from inside of the coupling groove to outside of the coupling groove, and a rotating link; and a support module including a magnet, the support module being lockable to, and unlockable from, the support bracket. The support bracket and the support module may be configured so that the support module is insertable in the coupling groove so that a magnetic force of the magnet moves the locking link from outside of the coupling groove to inside of the coupling groove so as to contact the support module and thereby lock the support module to the support bracket, and when the rotating link is rotated while the support module is locked to the support bracket, the rotating link moves the locking link from inside of the coupling groove to outside of the coupling groove and thereby unlocks the support module from the support bracket.

According to an embodiment of the disclosure, the locking link is configured to include a magnetic body such that the locking link moves toward the magnet by the magnetic force of the magnet.

According to an embodiment of the disclosure, while the support module is locked to the support bracket, the support module supports the support bracket and the display module such that the display module is rotatable between a first mode in which long sides of the display module are positioned horizontally, and a second mode in which the long sides of the display module are positioned vertically.

According to an embodiment of the disclosure, the support bracket includes a fixing plate accommodating the locking link such that the locking link is movable between a first location at which the locking link is positioned outside of the coupling groove and a second location at which at least one portion of the locking link is positioned inside of the coupling groove; and a rotating plate coupled to the fixing plate so as to be rotatable with respect to the fixing plate, and configured to move the locking link from the second location to the first location by rotating with respect to the fixing plate.

According to an embodiment of the disclosure, a rotating guide hole is formed in the rotating plate, and the rotating link includes a rotating guide protrusion inserted in the rotating guide hole and configured to rotate the rotating plate according to a rotation of the rotating link.

According to an embodiment of the disclosure, a guide hole is formed in the rotating plate, and the locking link includes a guide protrusion inserted in the guide hole and configured to move inside the guide hole to guide a movement of the locking link according to a rotation of the rotating plate.

According to an embodiment of the disclosure, the support bracket includes a push member protruding toward a rear direction of the display module from the rear surface of the display module, and the push member is configured to rotate the rotating link by being pushed toward a front direction of the display module.

According to an embodiment of the disclosure, the push member includes a first inclined surface inclined with respect to a first direction toward the front direction of the display module from behind the display module, and a second direction being perpendicular to the first direction, and the rotating link includes a second inclined surface facing the first inclined surface.

According to an embodiment of the disclosure, the first inclined surface is configured to guide the second inclined surface such that the rotating link rotates according to a movement of the push member in the first direction.

According to an embodiment of the disclosure, a sliding hole is formed in the fixing plate, the rotating link includes a sliding protrusion passing through the sliding hole and protruding toward the rear direction of the display module, and the rotating link is configured to rotate according to a sliding of the sliding protrusion in the sliding hole.

According to an embodiment of the disclosure, the support module includes a fixing body, and a rotating body accommodating the magnet, and coupled to the fixing body so as to be rotatable with respect to the fixing body.

According to an embodiment of the disclosure, the support module includes a locking groove in which the locking link is insertable to thereby lock the support module to the support bracket.

According to an embodiment of the disclosure, the fixing body is substantially in a shape of a cylinder, the rotating body is substantially in a shape of a quadrangular column, and the locking groove includes a plurality of locking grooves respectively provided in four side surfaces of the rotating body.

According to an embodiment of the disclosure, the fixing plate includes a plate portion forming at least one portion of the rear surface of the display module.

According to an embodiment of the disclosure, the display apparatus further includes a stand coupled to the support module and configured to support the display module, wherein the stand is coupled to the fixing body of the support module, and the support module is locked to the support bracket by inserting the rotating body in the coupling groove, whereby the magnetic force of the magnet moves the locking link from outside of the coupling groove to inside of the coupling groove to contact the support module.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
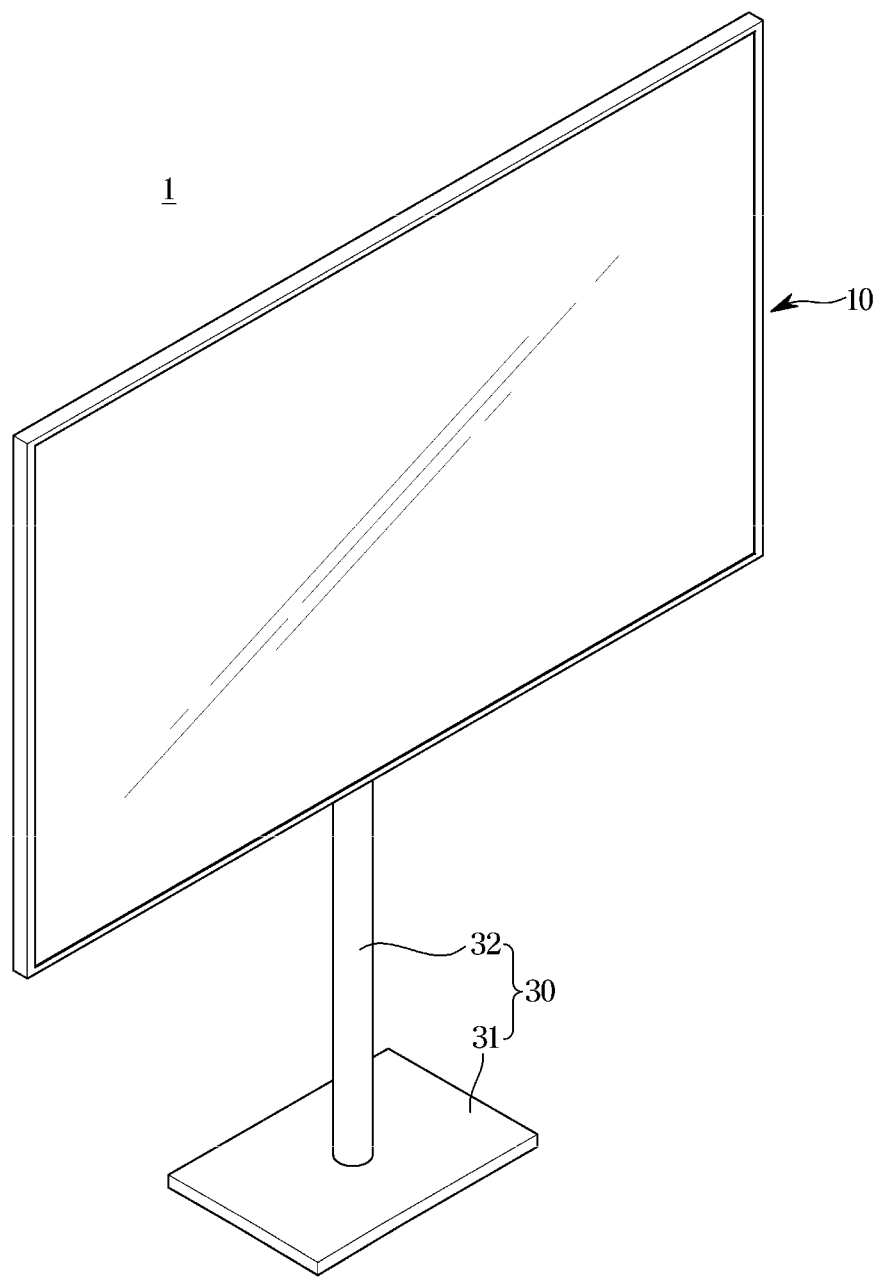
FIG. 1 is a perspective view of a display apparatus according to an embodiment of the disclosure.

Configurations illustrated in the embodiments and the drawings described in the present specification are only the preferred examples of the disclosure, and thus it is to be understood that various modified examples, which may replace the embodiments and the drawings described in the present specification, are possible when filing the present application.

Also, like reference numerals or symbols denoted in the drawings of the present specification represent members or components that perform the substantially same functions.

Also, the terms used in the present specification are used for describing the embodiments, not for the purpose of limiting and/or restricting the disclosure. It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

Also, it will be understood that, although the terms including ordinal numbers, such as "first", "second", etc., may be used herein to describe various components, these components should not be limited by these terms. These terms are only used to distinguish one component from another. For example, a first component could be termed a second component, and, similarly, a second component could be termed a first component, without departing from the scope of the disclosure. As used herein, the term "and/or" includes any and all combinations of one or more of associated listed items.

Meanwhile, in the following description, the terms "front", "rear", "left", "right", "upper", and "lower" are defined based on the drawings, and the shapes and positions of the components are not limited by the terms.

Throughout the disclosure, the expression "at least one of a, b or c" indicates only a, only b, only c, both a and b, both a and c, both b and c, all of a, b, and c, or variations thereof.

An aspect of the disclosure may provide a support module capable of being coupled to a rear surface of a display module by using a magnetic force without any separate coupling member.

An aspect of the disclosure may provide a support module capable of being separated from a rear surface of a display module by a push operation or a sliding operation without any separate coupling member.

According to an aspect of the disclosure, a support module detachably coupled to a stand may rotatably support a display module.

A display apparatus may include: a display module; a support bracket including a coupling groove provided on a rear surface of the display module, a locking link configured to be movable from outside of the coupling groove toward inside of the coupling groove, and a rotating link configured to move the locking link to the outside of the coupling groove; and a support module configured to be locked to the support bracket by being inserted in the coupling groove, and unlocked from the support bracket by rotating the rotating link, the support module including a magnet providing a magnetic force to move the locking link to the inside of the coupling groove.

Because the locking link is configured to include a magnetic body such that the locking link moves toward the magnet by a magnetic force of the magnet, the support module capable of being coupled to the rear surface of the display module by using a magnetic force without any separate coupling member may be provided.

While the support module is locked to the support bracket, the support module may support the support bracket and the display module such that the display module is rotatable between a first mode in which long sides of the display module are positioned horizontally and a second mode in which the long sides of the display module are positioned vertically.

The support bracket may further include: a fixing plate accommodating the locking link such that the locking link is movable between a first location at which the locking link is positioned outside the coupling groove and a second location at which at least one portion of the locking link is positioned inside the coupling groove; and a rotating plate coupled to the fixing plate in such a way to be rotatable with respect to the fixing plate, and configured to move the locking link from the second location to the first location by rotating with respect to the fixing plate.

The rotating plate may include a rotating guide hole.

The rotating link may include a rotating guide protrusion inserted in the rotating guide hole and configured to rotate the rotating plate according to a rotation of the rotating link.

The rotating plate may include a guide hole configured to guide a movement of the locking link according to a rotation of the rotating plate.

The locking link may include a guide protrusion configured to move inside the guide hole.

The support bracket may further include a push member protruding toward a rear direction of the display module from the rear surface of the display module.

The push member may be configured to rotate the rotating link by being pushed toward the front direction of the display module. The support module capable of being separated from the rear surface of the display module by an operation of pushing the push member without any separate coupling member may be provided.

The push member may include a first inclined surface inclined with respect to a first direction toward the front direction of the display module from behind the display module, and a second direction being perpendicular to the first direction.

The rotating link may include a second inclined surface facing the first inclined surface.

The first guide surface may guide the second guide surface such that the rotating link rotates according to a movement of the push member in the first direction.

The fixing plate may include a sliding hole.

The rotating link may further include a sliding protrusion passing through the sliding hole and protruding toward the rear direction of the display module.

The rotating link may be configured to rotate according to sliding of the sliding protrusion in the sliding hole.

The support module may include: a fixing body; and a rotating body coupled to the fixing body in such a way as to be rotatable with respect to the fixing body, and accommodating the magnet.

The support module may include a locking groove in which the locking link is inserted.

The fixing body may be substantially in a shape of a cylinder.

The rotating body may be substantially in a shape of a quadrangular column.

The locking groove may include a plurality of locking grooves respectively provided in four side surfaces of the rotating body.

The fixing plate may include a plate portion forming at least one portion of the rear surface of the display module.

The display apparatus may include a stand coupled to the support module and configured to support the display module.

The stand may be coupled to the support module by being coupled to the fixing body.

The support module may be locked to the support bracket by inserting the rotating body in the coupling groove.

In the present specification, the display module may include a speaker. For example, a portion of a front surface of the display module may be provided as a display for displaying a screen, and the remaining portion of the front surface may be provided as a speaker for outputting sound. The display module may have a square front surface. The display of the display module may have long sides and short sides, and the speaker of the display module may also have long sides and short sides.

Hereinafter, an embodiment of the disclosure will be described in detail with reference to the accompanying drawings.

Figure 2:
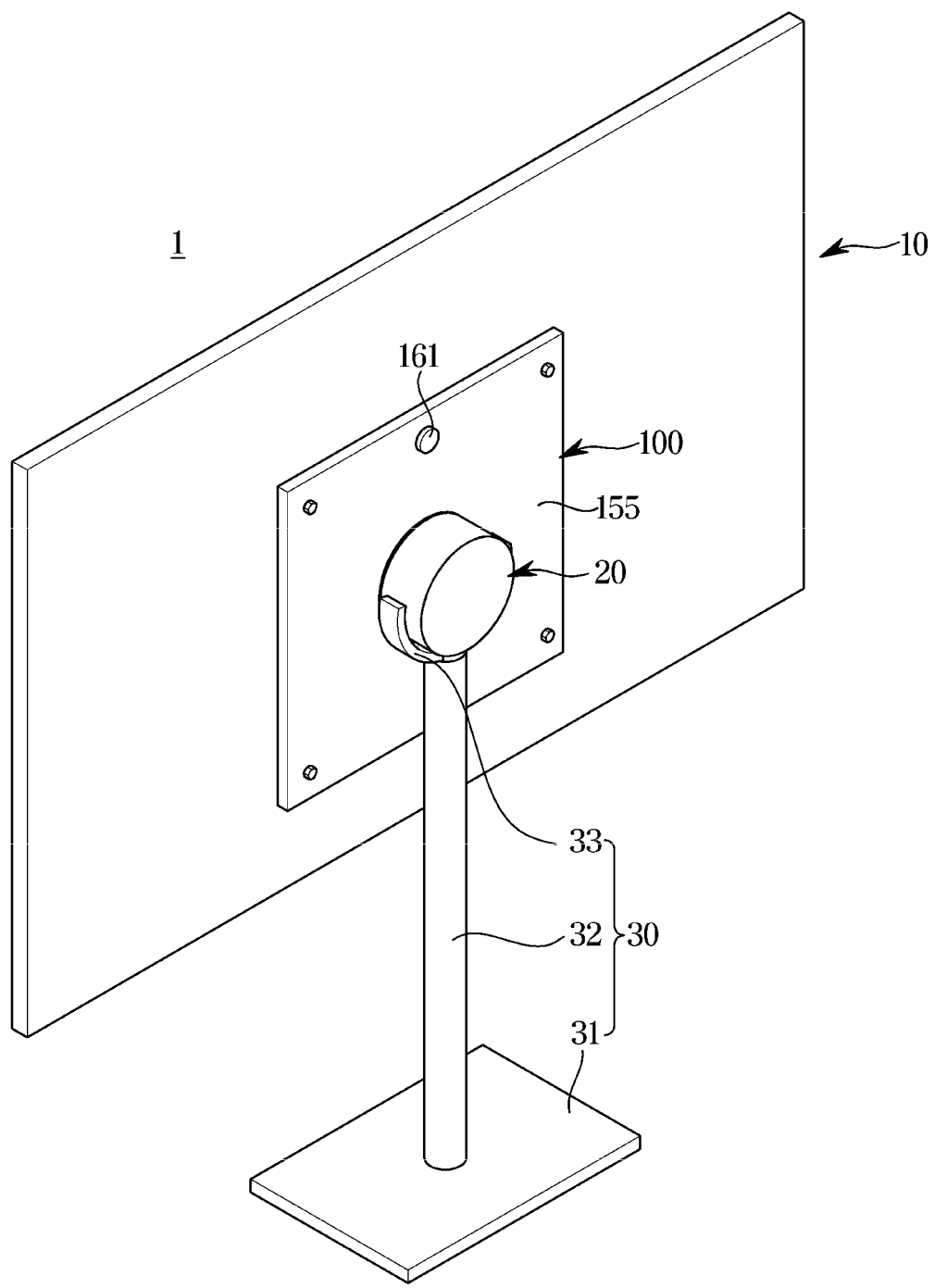
FIG. 2 is a rear perspective view of the display apparatus shown in FIG. 1 according to an embodiment of the disclosure.
Figure 3:
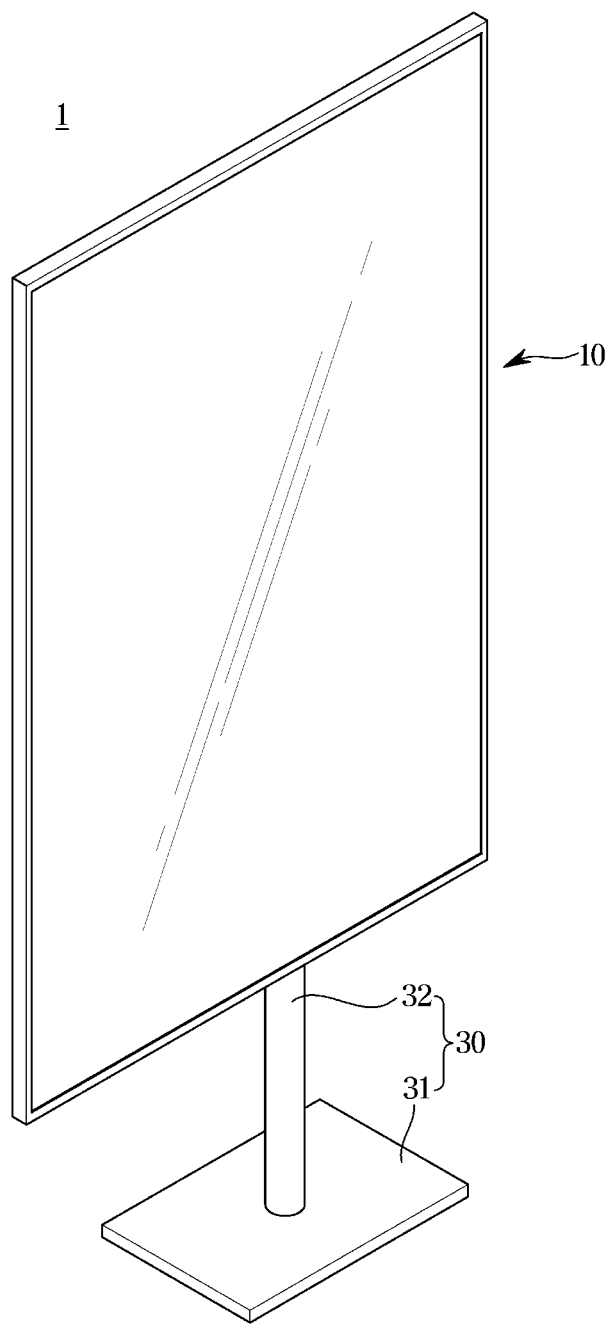
FIG. 3 shows a state in which a display module is positioned vertically in a display apparatus according to an embodiment of the disclosure.
Figure 4:
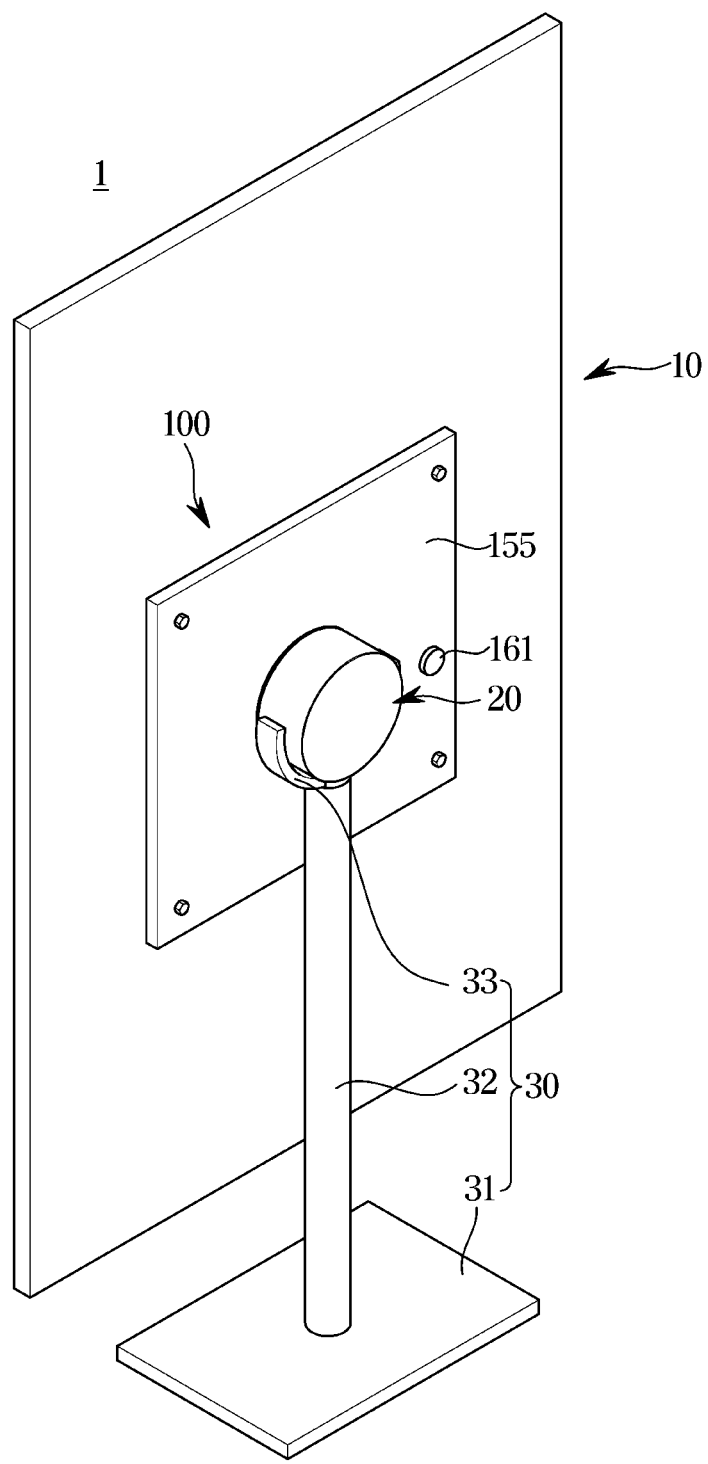
FIG. 4 is a rear perspective view of the display apparatus shown in FIG. 3 according to an embodiment of the disclosure.

FIG. 1 is a perspective view of a display apparatus according to an embodiment of the disclosure. FIG. 2 is a rear perspective view of the display apparatus shown in FIG. 1. FIG. 3 shows a state in which a display module is positioned vertically in a display apparatus according to an embodiment of the disclosure. FIG. 4 is a rear perspective view of the display apparatus shown in FIG. 3.

A display module 10 may be an apparatus for displaying information, materials, data, etc., in characters, figures, graphs, images, etc., and the display module 10 may include a television (TV), a monitor, etc.

The display module 10 may be configured to display a screen. The display module 10 may include a self-emissive display panel (not shown) such as Organic Light Emitting Diodes (OLEDs) or a non-emissive display panel (not shown) such as a Liquid Crystal Display (LCD). However, a kind of the display panel is not limited.

Referring to FIGS. 1 to 4, a width length of the display module 10 may be different from a height length of the display module 10. That is, the display module 10 may have long sides and short sides. The display module 10 may be in a shape of a rectangular plate. Also, unlike the display module 10 shown in the drawings, the display module 10 may be a curved display of which long sides are rounded.

According to an embodiment of the disclosure, a display apparatus 1 may include the display module 10, and support devices 20 and 30 supporting the display module 10. The display module 10 may include a support bracket 100. The support bracket 100 may form a portion of a rear surface of the display module 10. The support devices 20 and 30 may include a support module 20 and a stand 30.

The support devices 20 and 30 may rotatably support the display module 10. More specifically, the support module 20 may support the display module 10 such that the display module 10 is rotatable between a horizontal mode in which the long sides of the display module 10 are positioned horizontally and a vertical mode in which the long sides of the display module 10 are positioned vertically. Meanwhile, although not shown in the drawings, the support module 20 may be coupled to a wall mount bracket mounted on a wall.

The stand 30 may be coupled to the support module 20 to support the display module 10. The stand 30 may include a stand base 31 which is in contact with a floor, a stand neck 32 extending upward from the stand base 31, and a module support portion 33 coupled to the support module 20 and supporting the support module 20.

Figure 5:
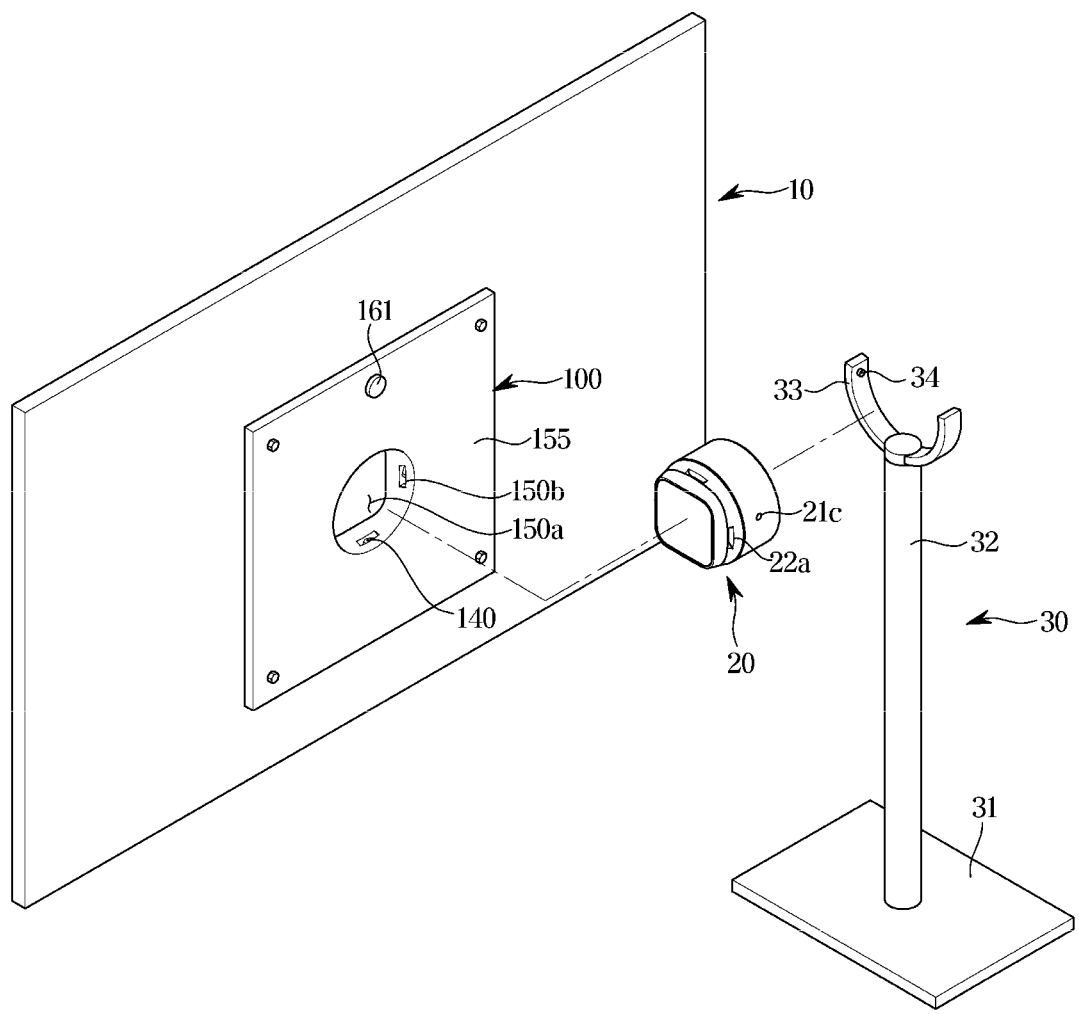
FIG. 5 is an exploded view of a display module, a support module, and a stand, in a display apparatus according to an embodiment of the disclosure.

FIG. 5 is an exploded view of a display module, a support module, and a stand, in a display apparatus according to an embodiment of the disclosure.

Referring to FIG. 5, the support module 20 may be separated from the display module 10. Also, the support module 20 may be separated from the stand 30.

According to an embodiment of the disclosure, the support bracket 100 may be coupled to the rear surface of the display module 10. The support bracket 100 may include a coupling groove 150a in which the support module 20 is inserted. In a side surface of the coupling groove 150a, a locking hole 150b which a locking link 140 is withdrawn from or inserted in may be provided. A plate portion 155 of the support bracket 100 may form at least one portion of the rear surface of the display module 10. The support bracket 100 may include a button 161 for unlocking the support module 20 locked to the support bracket 100 by being pushed.

The support module 20 may include a fixing groove 21c in which a fixing protrusion 34 of the module support portion 33 is inserted. The support module 20 may include a locking groove 22a in which the locking link 140 is inserted. The module support portion 33, the fixing protrusion 34, and the fixing groove 21c may be exemplary structures for coupling the support module 20 to the stand 30, and there may be various structures for coupling the support module 20 to the stand 30.

According to insertion of the support module 20 in the coupling groove 150a of the support bracket 100, the locking link 140 may be inserted in the locking groove 22a, and thereby, the support module 20 may be coupled and locked to the support bracket 100.

By inserting the support module 20 into the coupling groove 150a, the support module 20 may be coupled to the support bracket 100 and the display module 10. Upon coupling of the support module 20 to the support bracket 100, the support module 20 may be locked to the support bracket 100. After the support module 20 is locked to the support bracket 100, rotating bodies 22 and 23 (see FIG. 6) of the support module 20 may rotate together with the display module 10.

By pushing the button 161, the support module 20 may be unlocked from the support bracket 100. After the support module 20 is unlocked from the support bracket 100, the support module 20 may be separated from the support bracket 100.

According to an embodiment of the disclosure, the support module 20 may be locked to the support bracket 100 without any separate coupling member, and also, the support module 20 may be unlocked from the support bracket 100 without any coupling member. A user may freely separate the support module 20 from the display module 10 or couple the support module 20 to the display module 10. The user may freely separate the support module 20 from the stand 30 or couple the support module 20 to the stand 30. Thereby, the user may use the display module 10 separated from the stand 30 or coupled to the support module 20 and the stand 30.

Figure 6:
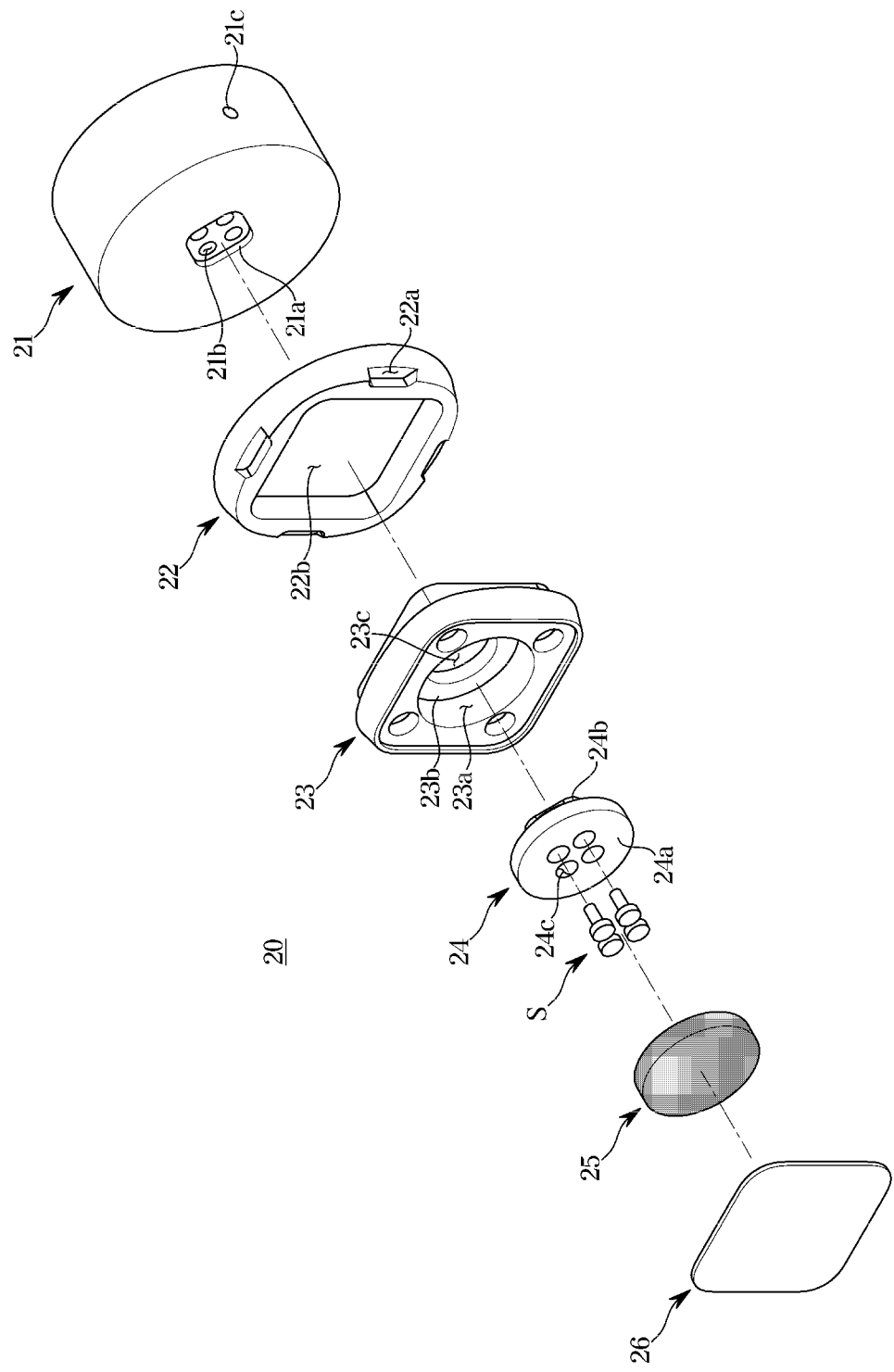
FIG. 6 is an exploded perspective view of a support module in a display apparatus according to an embodiment of the disclosure.

FIG. 6 is an exploded perspective view of a support module in a display apparatus according to an embodiment of the disclosure.

Hereinafter, a structure of a support module according to an embodiment of the disclosure will be described in detail with reference to FIG. 6.

Referring to FIG. 6, the support module 20 may include a fixing body 21, the rotating bodies 22 and 23 rotatably coupled to the fixing body 21, a coupling body 24 coupling the rotating bodies 22 and 23 to the fixing body 21 such that the rotating bodies 22 and 23 are rotatable with respect to the fixing body 21, and a magnet 25 accommodated in the rotating bodies 22 and 23. The support module 20 may include a magnet cover 26 coupled to the rotating bodies 22 and 23 to cover one surface of the magnet 25 such that the magnet 25 is not exposed to outside.

According to an embodiment of the disclosure, the fixing body 21 may be in a shape of a cylinder. Because the fixing body 21 is in a shape of a cylinder, a user may intuitively recognize that the support module 20 rotatably supports the display module 10. However, the shape of the fixing body 21 is not limited to a cylinder, and the fixing body 21 may be in a shape of a polygonal column.

The fixing body 21 may include a fixing groove 21c in which the fixing protrusion 34 of the module support portion 33 is inserted. As described above, a structure by which the stand 30 supports the fixing body 21 may include various structures, in addition to the module support portion 33, the fixing protrusion 34, and the fixing groove 21c.

The fixing body 21 may include a recessed portion 21a to which the coupling body 24 is coupled, and a coupling hole 21b provided in the recessed portion 21a. The recessed portion 21a may correspond to a coupling portion 24b of the coupling member 24 such that the coupling portion 24b is inserted in the recessed portion 21a.

The rotating bodies 22 and 23 may include a first rotating body 22, and a second rotating body 23 coupled to the first rotating body 22. The first rotating body 22 and the second rotating body 23 may be integrated into one body.

The first rotating body 22 may include a quadrangular hollow portion 22b in which the second rotating body 23 is inserted. A rear surface of the first rotating body 22 may be in a shape of a circle, and a front surface of the first rotating body 22 may be in a shape of a quadrangle. The rear surface of the first rotating body 22 may be in contact with a front surface of the fixing body 21. The rear surface of the first rotating body 22 may be rotatable with respect to the front surface of the fixing body 21.

The first rotating body 22 may include a plurality of locking grooves 22a respectively provided in sides of the quadrangular hollow portion 22b. At least one portion of the locking link 140 may be inserted in each locking groove 22a.

The second rotating body 23 may be coupled to the first rotating body 22. The second rotating body 23 may accommodate the coupling member 24 and the magnet 25. The second rotating body 23 may include a body accommodating portion 23a accommodating a body portion 24a of the coupling member 24, a body support portion 23b supporting one surface of the body portion 24a, and a through hole 23c which the coupling portion 24b of the coupling member 24 penetrates.

The coupling member 24 may include the body portion 24a being in a shape of a disk, the coupling portion 24b extending in a rear direction from the body portion 24a and coupled to the fixing body 21, and a coupling hole 24c penetrating the coupling member 24 in a front-rear direction.

The body portion 24a of the coupling member 24 may be accommodated in the body accommodating portion 23a, and the coupling portion 24b of the coupling member 24 may be inserted in the recessed portion 21 of the fixing body 21 by penetrating the through hole 23c.

A coupling member S may be inserted in and coupled to the coupling hole 24c of the coupling member 24 and the coupling hole 21b of the fixing body 21. The coupling member S may include a screw, although it is not limited thereto.

The magnet 25 may be in a shape of a disk. However, the magnet 25 may be in a shape of a quadrangular plate. The magnet 25 may be accommodated in the body accommodating portion 23a together with the coupling member 24.

The magnet cover 26 may be coupled to one surface of the second rotating body 23 to cover the magnet 25. The magnet cover 26 may be coupled to the second rotating body 23 to prevent the magnet 25 from being exposed to the outside or being separated from the second rotating body 23.

Figure 7:
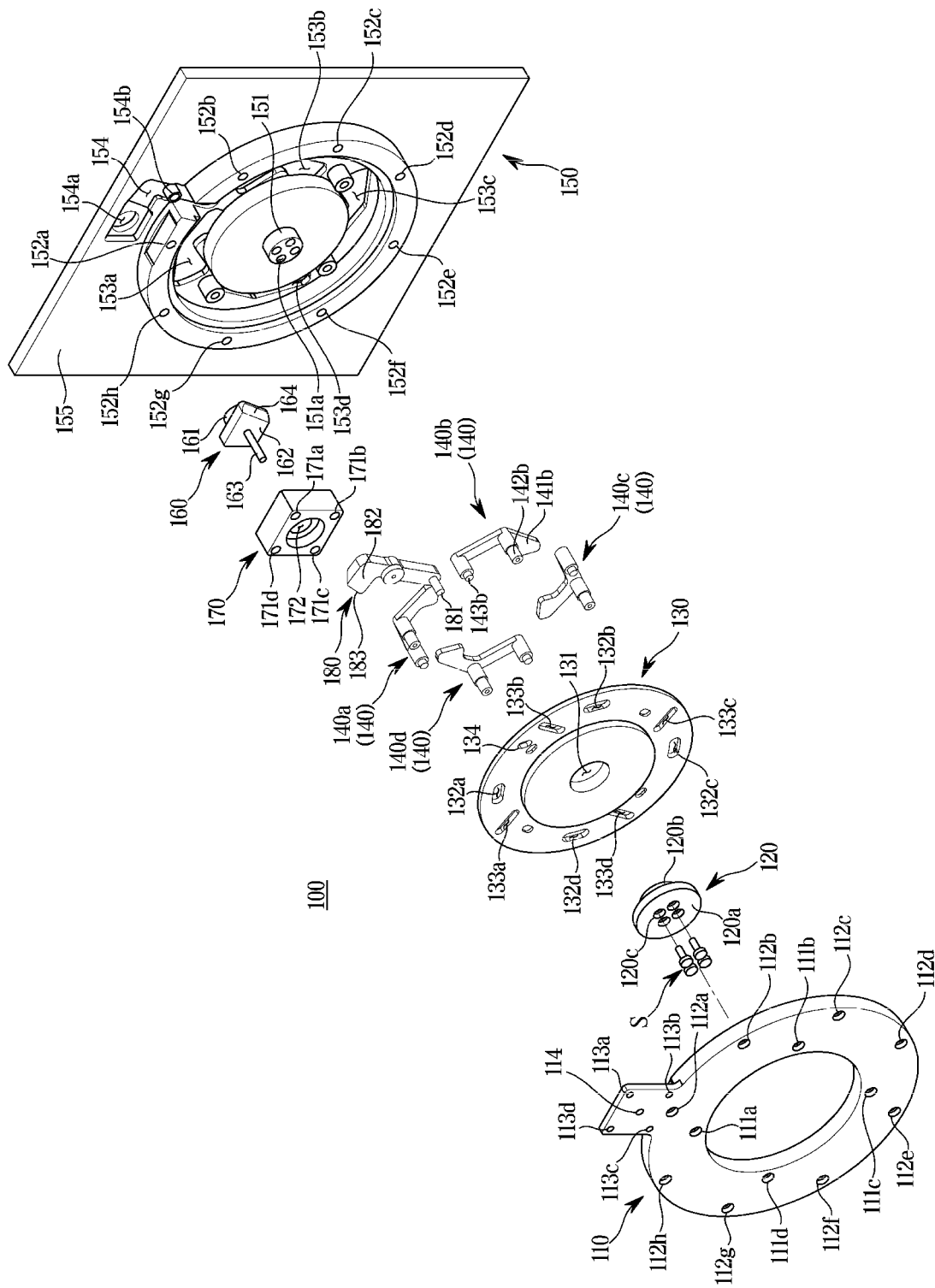
FIG. 7 is an exploded perspective view of a support bracket in a display apparatus according to an embodiment of the disclosure.
Figure 8:
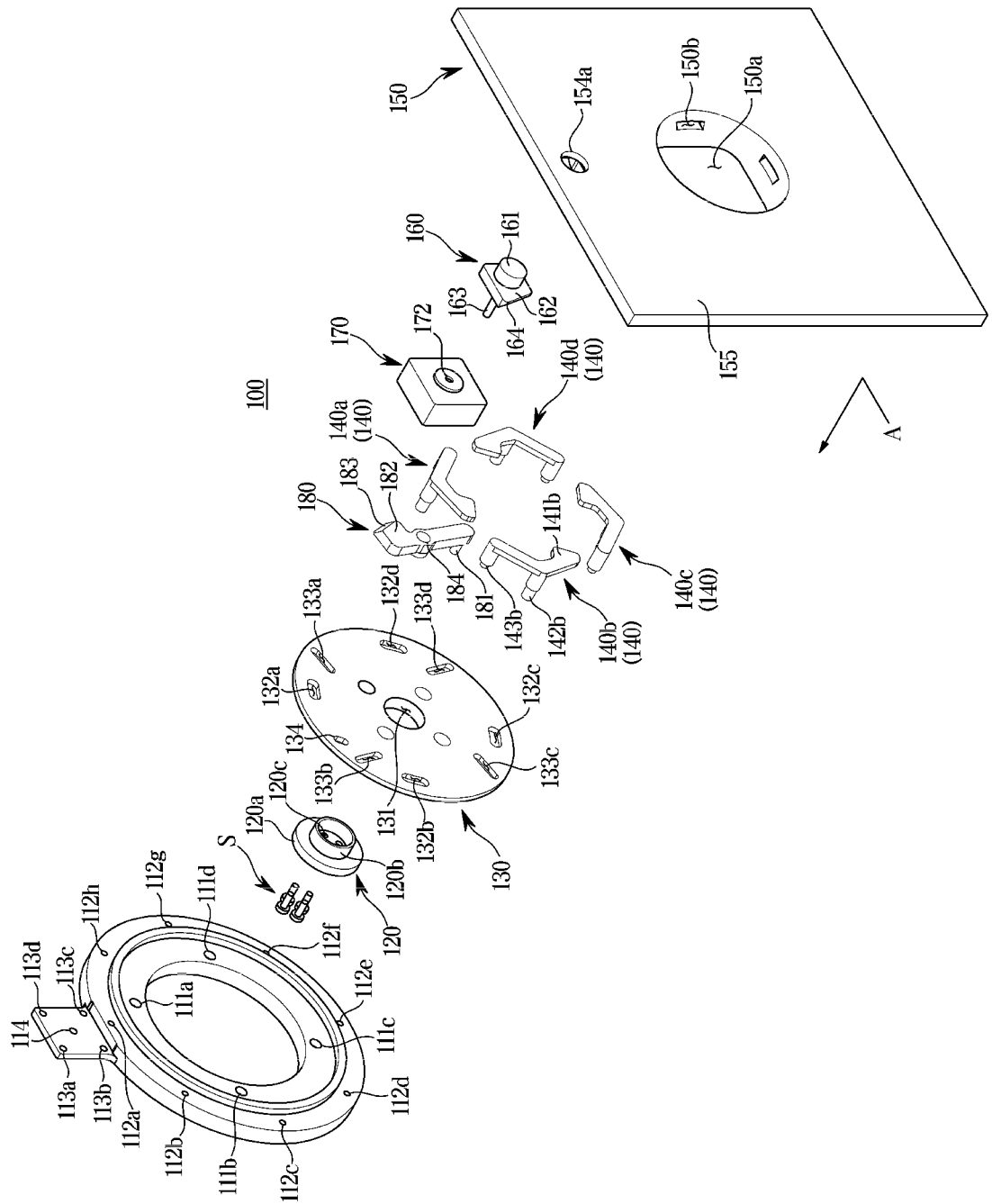
FIG. 8 shows the support bracket of FIG. 7 at another angle according to an embodiment of the disclosure.

FIG. 7 is an exploded perspective view of a support bracket in a display apparatus according to an embodiment of the disclosure. FIG. 8 shows the support bracket of FIG. 7 at another angle.

Hereinafter, a structure of a support bracket according to an embodiment of the disclosure will be described in detail with reference to FIGS. 7 and 8.

Referring to FIGS. 7 and 8, the support bracket 100 may include a coupling plate 110, a rotating plate 130 being rotatable with respect to the coupling plate 110 within a preset angle range, the locking link 140, a rotating link 180, and a fixing plate 150 accommodating the locking link 140 and the rotating link 180. The support bracket 100 may include a coupling member 120 coupling the rotating plate 130 to the fixing plate 150. The support bracket 100 may include a push member 160 for rotating the rotating link 180 by being pushed, and a push member support portion 170 supporting a movement of the push member 160.

The fixing plate 150 may include a plate portion 155 forming at least one portion of the rear surface of the display module 10, and a button hole 154a formed by penetrating the plate portion 155. The fixing plate 150 may include the coupling groove 150a formed in a rear surface of the plate portion 155, and the locking hole 150b formed by opening a portion of a side surface of the coupling groove 150a, wherein at least one portion of the locking link 140 passes through the locking hole 150b.

The fixing plate 150 may include a coupling portion 151 coupled to the coupling member 120. The coupling portion 151 may include a coupling hole 151a to which a coupling member S is coupled.

The fixing plate 150 may include a plurality of coupling holes 152a to 152h for coupling the coupling plate 110 to the fixing plate 150. The coupling plate 110 may include a plurality of coupling holes 112a to 112h respectively corresponding to the plurality of coupling holes 152a to 152h provided in the fixing plate 150. By causing a coupling member to penetrate the coupling holes 112a to 112h of the coupling plate 110 and be coupled to the coupling holes 152a to 152h of the fixing plate 150, the coupling plate 110 may be coupled to the fixing plate 150 in such a way as to be fixed to the fixing plate 150.

The fixing plate 150 may include a link accommodating groove 153a to 153d accommodating the locking link 140. According to an embodiment of the disclosure, the locking link 140 may include four locking links 140a, 140b, 140c, and 140d, and the fixing plate 150 may include four link accommodating grooves 153a, 153b, 153c, and 153d. The locking link 140 may be accommodated in the link accommodating grooves 153a to 153d to rotate within a preset angle range.

The fixing plate 150 may include a rotating link accommodating groove 154 accommodating the rotating link 180, the button hole 154a in which the button 161 of the push member 160 is inserted, and a protrusion portion 154b that is a rotation shaft of the rotating link 180. The rotating link 180 may be accommodated in the rotating link accommodating groove 154 to rotate within a preset angle range.

The rotating plate 130 may include a through hole 131 formed in a center of the rotating plate 130, wherein the coupling portion 120b of the coupling member 120 penetrates the through hole 131. The coupling portion 120b of the coupling member 120 may pass through the through hole 131 and be coupled to the coupling portion 151 of the fixing plate 150. A body portion 120a of the coupling member 120 may have a greater diameter than the through hole 131 to be prevented from passing through the through hole 131.

Because the four locking links 140a, 140b, 140c, and 140d have the same structure, four shaft holes 132a, 132b, 132c, and 132d have the same structure, and four guide holes 133a, 133b, 133c, and 133d have the same structure, a locking link 140b, a shaft hole 132b, and a guide hole 133d will be described as examples.

The locking link 140b may include a locking protrusion 141b inserted in the locking groove 22a of the support module 20, a shaft protrusion 142b that is a rotation shaft of the locking link 140b, and a guide protrusion 143b that rotates the locking link 140b by interworking with a rotation of the rotating plate 130.

The rotating plate 130 may include a shaft hole 132b and a guide hole 133b in which the shaft protrusion 142b and the guide protrusion 143b of the locking link 140b are respectively inserted. The shaft protrusion 142b may be movable relatively with respect to the shaft hole 132b along the shaft hole 132b, and the guide protrusion 143b may be movable relatively with respect to the guide hole 133b along the guide hole 133b. In other words, the shaft protrusion 142b may be movable between one end and the other end of the shaft hole 132b, and the guide protrusion 143b may be movable between one end and the other end of the guide hole 133b.

The rotating plate 130 may include a rotating guide hole 134 in which a rotating guide protrusion 181 of the rotating link 180 is inserted. The rotating guide protrusion 181 may be movable in the rotating guide hole 134.

According to a rotation of the rotating link 180, the rotating guide protrusion 181 may move from one end of the rotating guide hole 134 to the other end of the rotating guide hole 134, and by interworking with the movement of the rotating guide protrusion 181, the rotating plate 130 may rotate with respect to the fixing plate 150.

The rotating link 180 may include the rotating guide protrusion 181, a rotating protrusion 182 engaged with the push member 160, and a first inclined surface 183 provided on the rotating protrusion 182. The rotating link 180 may include a shaft groove 184 in which the protrusion portion 154b being the rotation shaft of the rotating link 180 is inserted.

The push member 160 may include the button 161 that protrudes in the rear direction of the display module 10 from the rear surface of the display module 10 through the button hole 154a of the fixing plate 150, a push body 162 having a wider area than the button 161 to be prevented from passing through the button hole 154a, a shaft 163 protruding in a front direction from the push body 162, and a second inclined surface 164 guiding the first inclined surface 183.

The push member support portion 170 may include a first shaft guide hole 172 in which the shaft 163 of the push member 160 is inserted. The first shaft guide hole 172 may enable the push member 160 to move in the front-rear direction by guiding the shaft 163 to move in the front-rear direction.

The coupling plate 110 may include a plurality of shaft coupling holes 111a, 111b, 111c, and 111d corresponding to the respective shaft holes 132a, 132b, 132c, and 132d. A coupling member may penetrate the shaft coupling holes 111a, 111b, 111c, and 111d and be coupled to the shaft protrusion 142b penetrated the shaft holes 132a, 132b, 132c, and 132d.

The coupling plate 110 may include a plurality of coupling holes 113a, 113b, 113c, and 113d corresponding to a plurality of coupling holes 171a, 171b, 171c, and 171d of the push member support portion 170. The coupling plate 110 may include a second shaft guide hole 114 in which the shaft 163 of the push member 160 is inserted.

Figure 9:
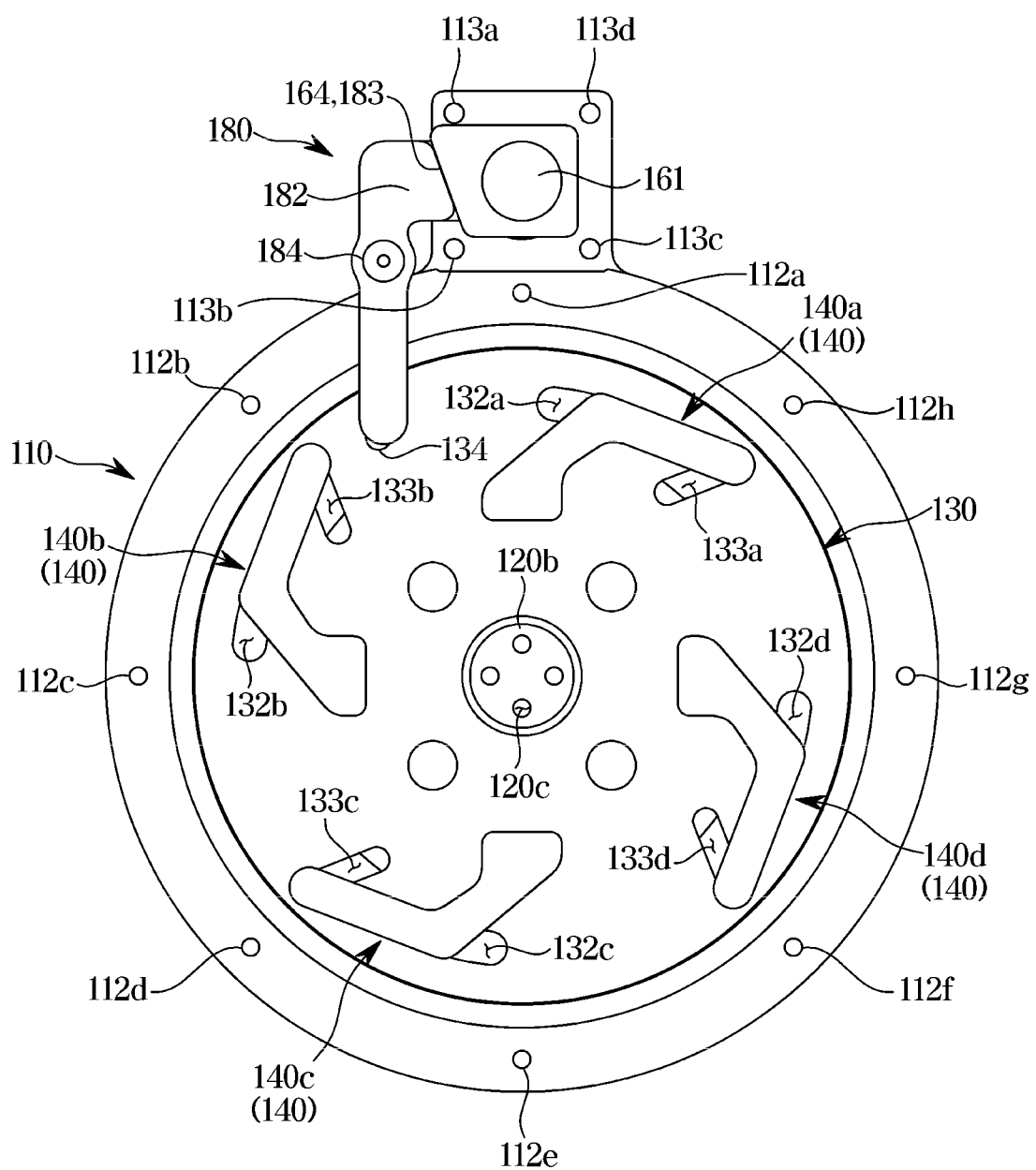
FIG. 9 shows a state of the support bracket seen in an A direction of FIG. 8 according to an embodiment of the disclosure, before a rotation link and a rotation plate rotate.
Figure 10:
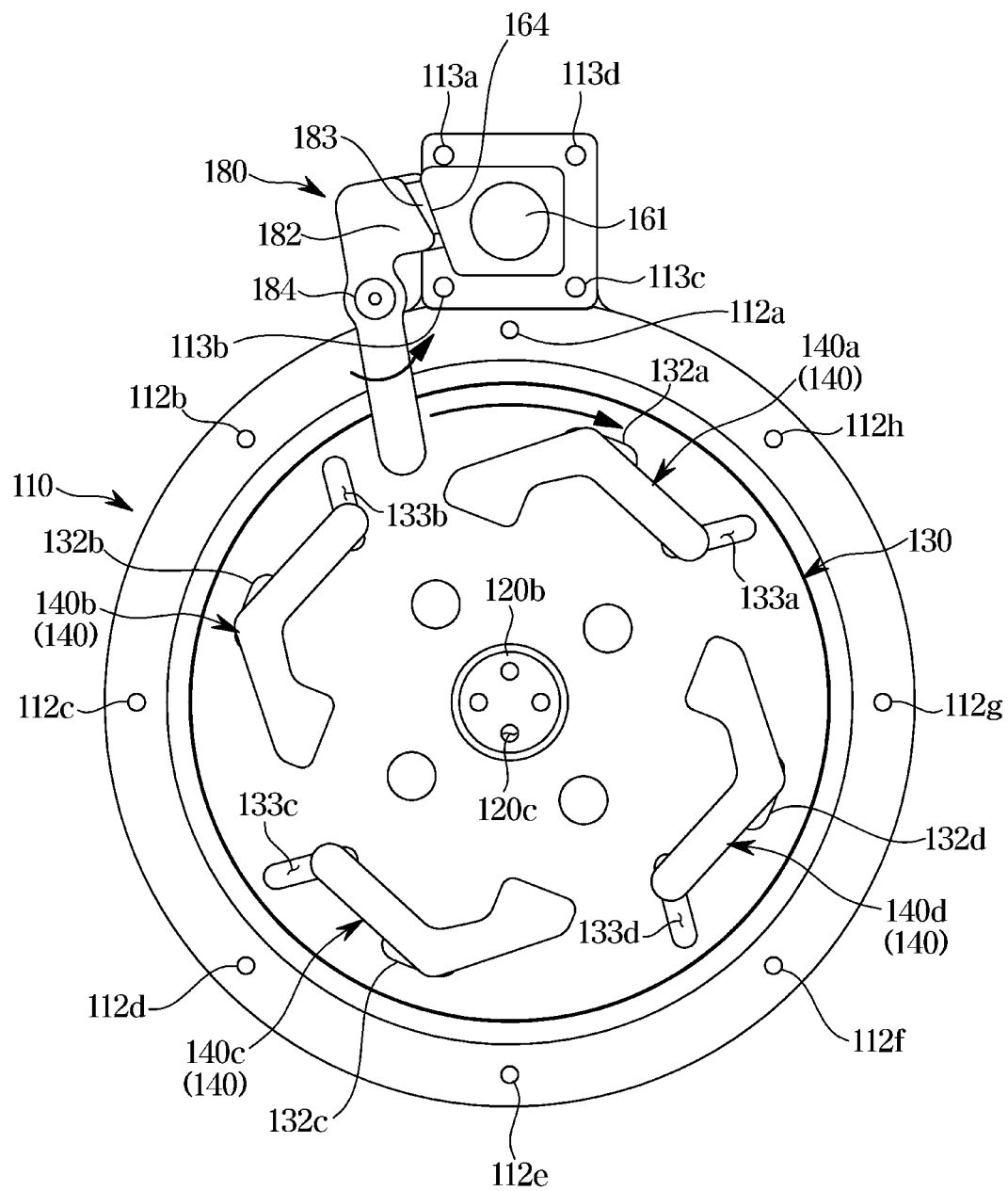
FIG. 10 shows a state of the support bracket seen in the A direction of FIG. 8 according to an embodiment of the disclosure, after the rotation link and the rotation plate rotate.

FIG. 9 shows a state of the support bracket seen in an A direction of FIG. 8, before a rotation link and a rotation plate rotate. FIG. 10 shows a state of the support bracket seen in the A direction of FIG. 8, after the rotation link and the rotation plate rotate.

Referring to FIG. 9, according to insertion of the support module 20 in the coupling groove 150a, the locking link 140 including a magnetic body may move to inside of the coupling groove 150a by a magnetic force of the magnet 25. An attraction force generated by the magnetic force may act between the magnet 25 and the locking link 140. After the support module 20 is inserted in the coupling groove 150a such that the magnet 25 is positioned inside the coupling groove 150a, the locking link 140 may penetrate the locking hole 150b from outside of the coupling groove 150a and move to the inside of the coupling groove 150a, by a magnetic force. The locking protrusion 141b of the locking link 140 moved to the inside of the coupling groove 150a may be inserted in the locking groove 22a of the support module 20. According to insertion of the locking protrusion 141b in the locking groove 22a, the support module 20 may be locked to the support bracket 100.

Referring to FIG. 9, while the locking protrusion 141b is positioned in the inside of the coupling groove 150a, the shaft protrusion 142b of the locking link 140 may be positioned at one end of the shaft hole 132b. While the locking protrusion 141b is positioned in the inside of the coupling groove 150a, the guide protrusion 143b of the locking link 140 may be positioned at one end of the guide hole 133b. While the locking protrusion 141b is positioned in the inside of the coupling groove 150a, the rotating guide protrusion 181 of the rotating link 180 may be positioned at one end of the rotating guide hole 134.

Referring to FIG. 10, by pushing the button 161 of the push member 160 toward the front direction of the display module 10, the rotating link 180 may rotate. According to the rotation of the rotating link 180, the rotating guide protrusion 181 may move from one end of the rotating guide hole 134 to the other end. According to the movement of the rotating guide protrusion 181 from the one end of the rotating guide hole 134 to the other end, the rotating plate 130 may rotate.

According to the rotation of the rotating plate 130, the locking protrusion 141b may move from the inside of the coupling groove 150a to the outside in radial direction of the coupling groove 150. The locking protrusion 141b may pass through the locking hole 150b and be positioned outside the coupling groove 150a.

Referring to FIG. 10, while the locking protrusion 141b is positioned outside the coupling groove 150a, the shaft protrusion 142b of the locking link 140 may be positioned at the other end of the shaft hole 132b. While the locking protrusion 141b is positioned outside the coupling groove 150a, the guide protrusion 143b of the locking link 140 may be positioned at the other end of the guide hole 133b.

Figure 11:
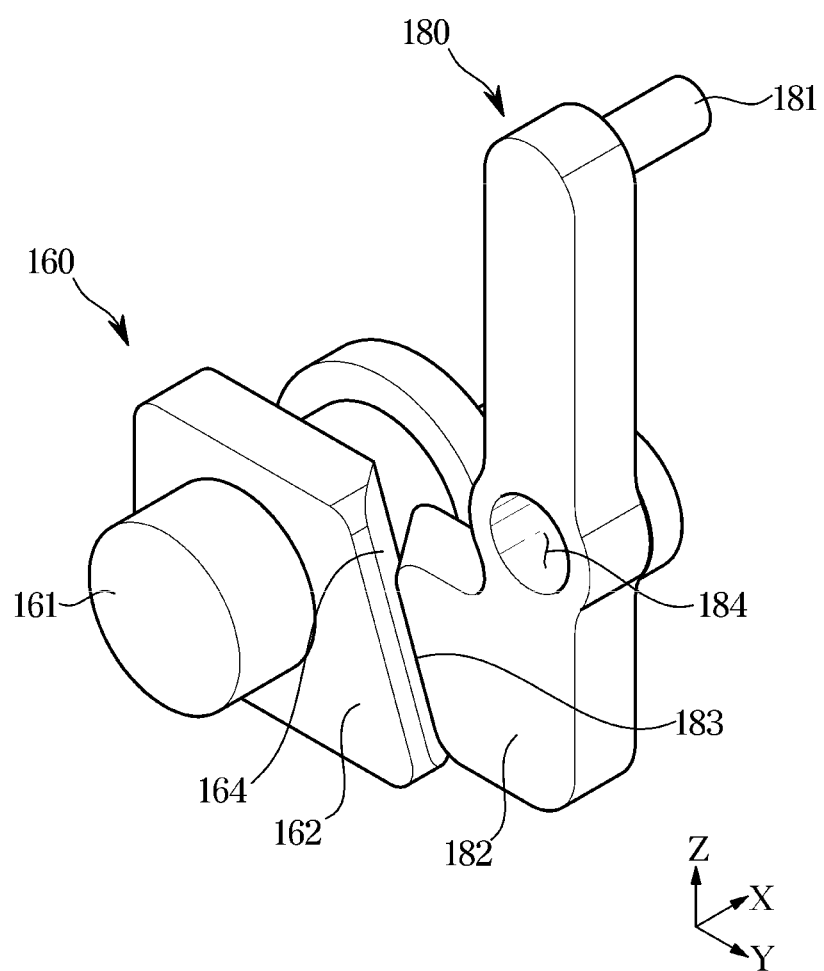
FIG. 11 shows a push member and a rotation link before the push member is pushed, in a display apparatus according to an embodiment of the disclosure.
Figure 12:
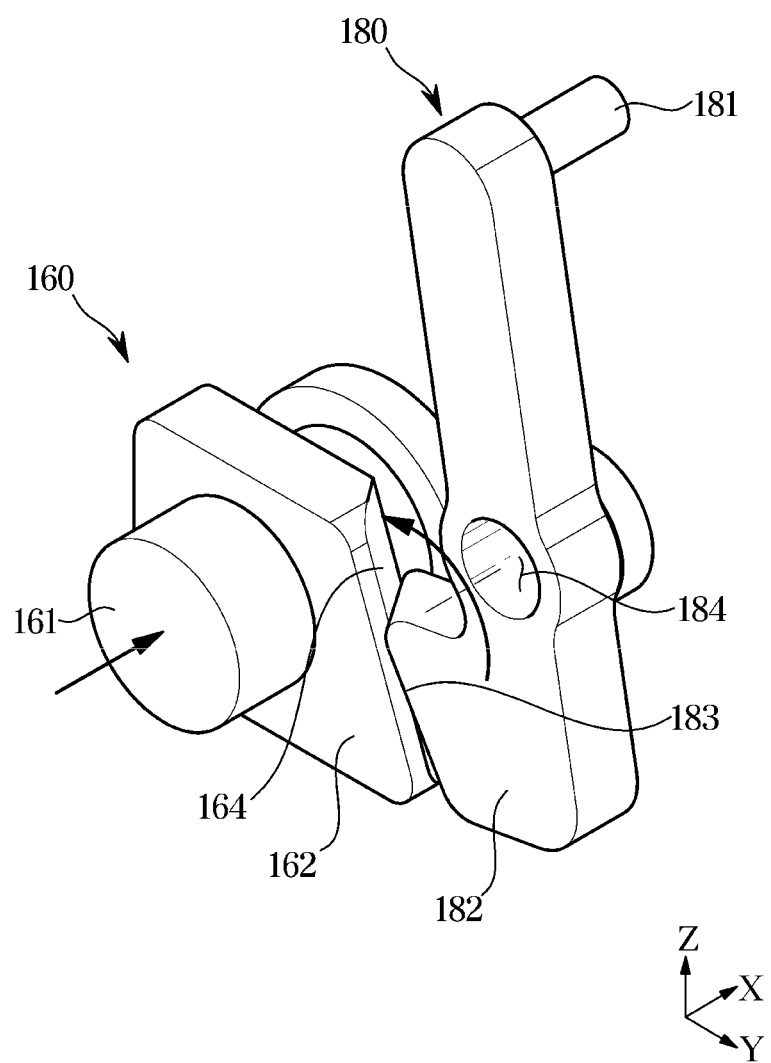
FIG. 12 shows a push member and a rotation link after the push member is pushed, in a display apparatus according to an embodiment of the disclosure.

FIG. 11 shows a push member and a rotation link before the push member is pushed, in a display apparatus according to an embodiment of the disclosure. FIG. 12 shows a push member and a rotation link after the push member is pushed, in a display apparatus according to an embodiment of the disclosure.

A structural relationship between the push member and the rotating link will be described in detail with reference to FIGS. 11 and 12.

Referring to FIG. 11, the push member 160 according to an embodiment of the disclosure may include the second inclined surface 164 inclined with respect to a first direction (X-axis direction) toward the front direction of the display module 10 from behind the display module 10, and inclined with respect to a second direction (Y-axis direction) being perpendicular to the first direction and toward a side of the display module 10. The second inclined surface 164 may be inclined with respect to the first direction, and also inclined with respect to the second direction.

Referring to FIG. 11, the rotating link 180 may include the first inclined surface 183 inclined with respect to the first direction and inclined with respect to the second direction, like the second inclined surface 164. The first inclined surface 183 may face the second inclined surface 164. The first inclined surface 183 may be in contact with the second inclined surface 164.

Referring to FIG. 12, by pushing the push member 160 in the first direction, the second inclined surface 164 may move in the first direction together with the push member 160. According to the movement of the second inclined surface 164 in the first direction, the first inclined surface 183 may move along the second inclined surface 164. According to the movement of the first inclined surface 183 along the second inclined surface 164, the rotating link 180 may rotate.

Accordingly, by pushing the push member 160, the rotating link 180 may rotate by interworking with a movement of the push member 160. The operation may be caused by the structures of the first inclined surface 164 and the second inclined surface 183 inclined with respect to the first direction and the second direction.

Figure 13:
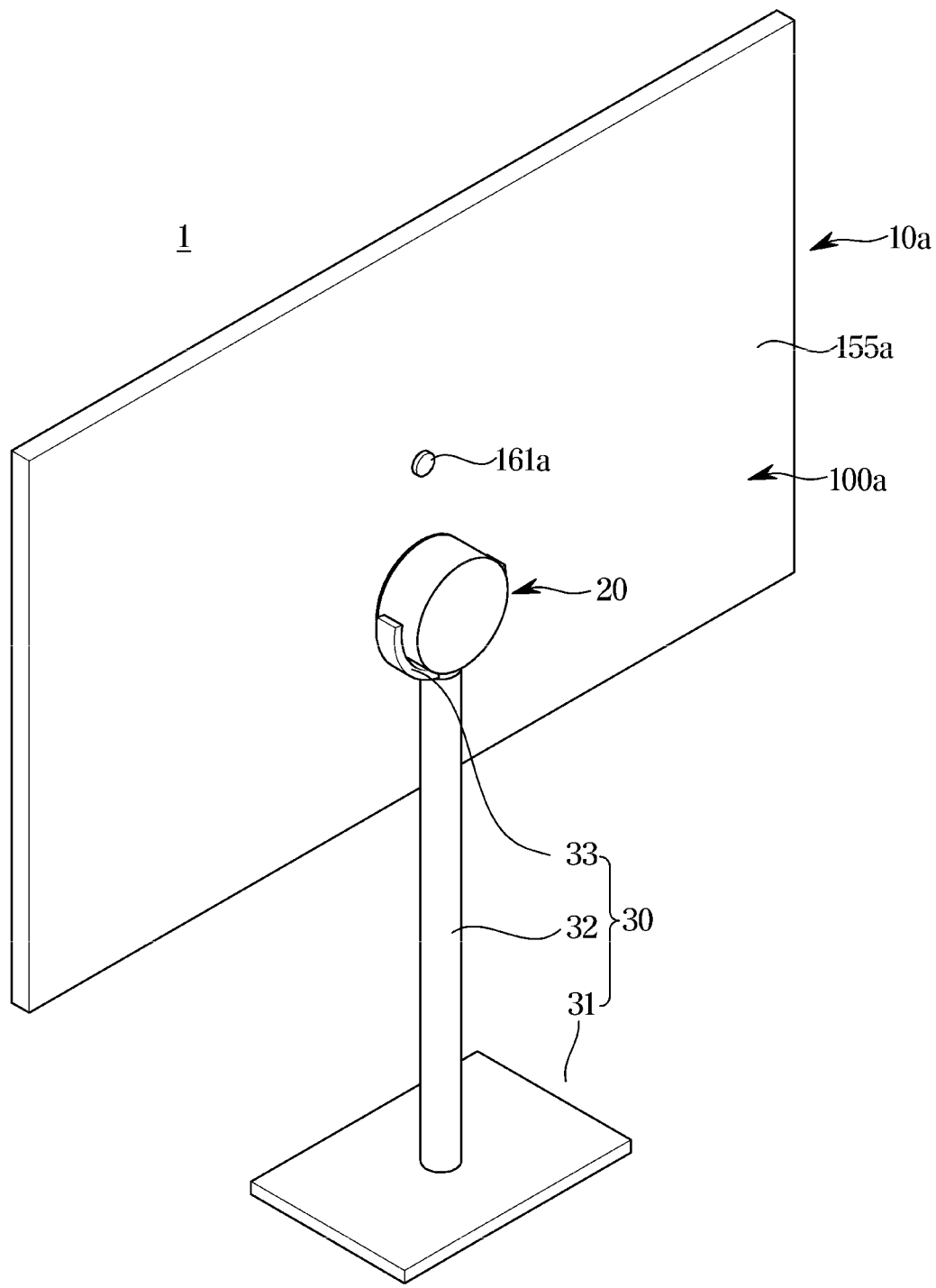
FIG. 13 is a rear perspective view of a display apparatus according to an embodiment of the disclosure.

FIG. 13 is a rear perspective view of a display apparatus according to an embodiment of the disclosure.

Referring to FIG. 13, in the display apparatus 1 according to an embodiment of the disclosure, a display module 10a may include a support bracket 100a. The support bracket 100a may include a plate portion 155a forming a rear surface of the display module 10a. In other words, the plate portion 155a may form the rear surface of the display module 10a. The support bracket 100a may include a button 161a protruding in the rear direction from the plate portion 155a. As such, because the plate portion 155a forms an entire rear surface of the display module 10a, the rear surface of the display module 10a may have a simple outer appearance.

Figure 14:
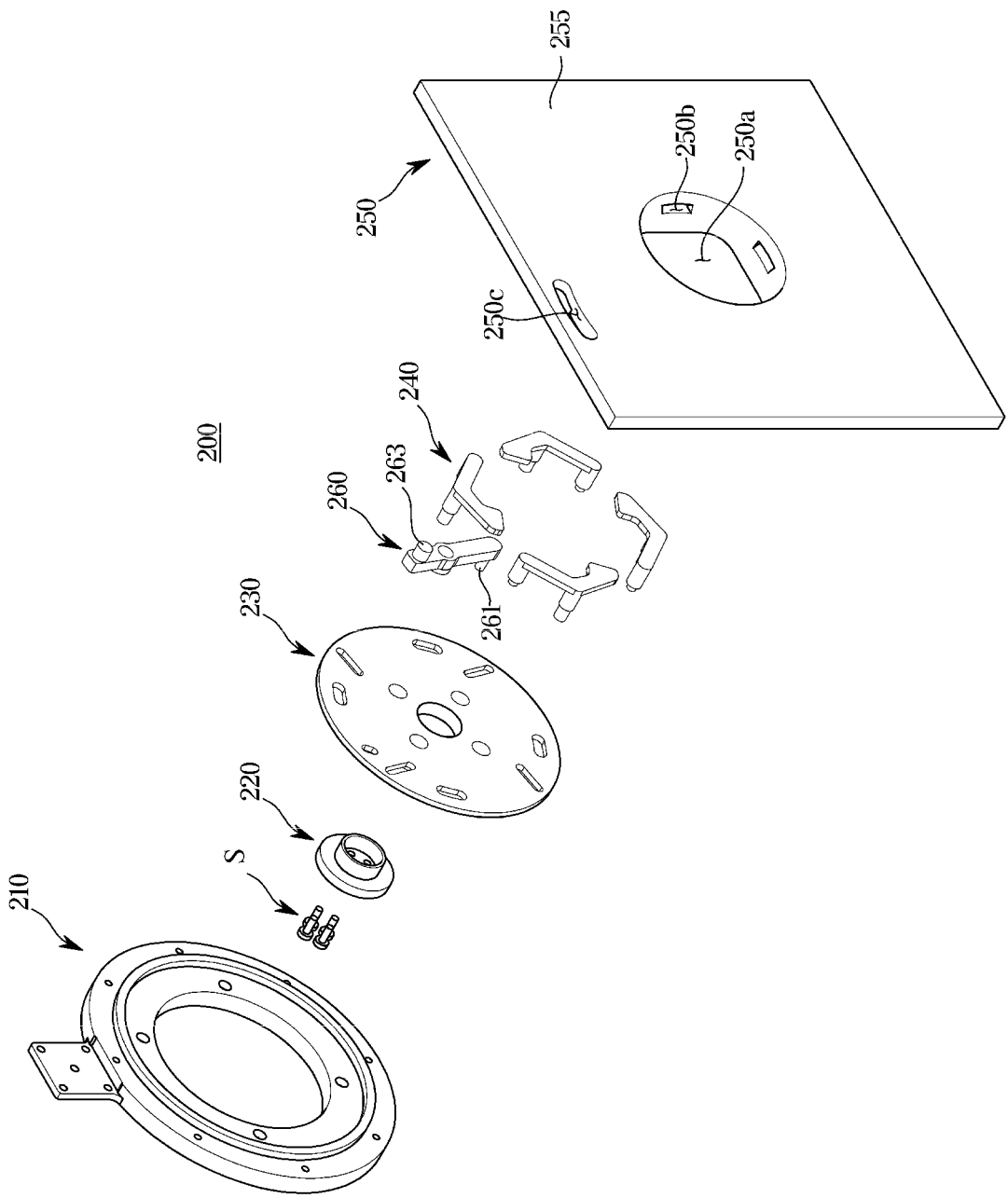
FIG. 14 is an exploded perspective view of a support bracket in a display apparatus according to an embodiment of the disclosure.

FIG. 14 is an exploded perspective view of a support bracket in a display apparatus according to an embodiment of the disclosure.

According to an embodiment of the disclosure, a support bracket 200 may include a coupling plate 210, a coupling member 220, a rotating plate 230, a locking link 240, a rotating link 260, and a fixing plate 250.

The coupling plate 210, the coupling member 220, the rotating plate 230, and the locking link 240 may have the same structures as those of the coupling plate 110, the coupling member 120, the rotating plate 130, and the locking link 140 described above.

According to an embodiment of the disclosure, the rotating link 260 may include a rotating guide protrusion 261, and a sliding protrusion 263 protruding in an opposite direction of a direction in which the rotating guide protrusion 261 protrudes. The fixing plate 250 may include a sliding hole 250c formed by opening a portion of the plate portion 255. The sliding protrusion 263 may penetrate the sliding hole 250c and protrude in the rear direction of the display module 10. A user may rotate the rotating link 260 by gripping the sliding protrusion 263 protruding in the rear direction of the display module 10 and then sliding the sliding protrusion 263 from one end of the sliding hole 250c to the other end. According to the rotation of the rotating link 260, the locking link 240 may move from inside of a coupling groove 250a to outside of the coupling groove 250a or from the outside of the coupling groove 250a to the inside of the coupling groove 250a.

According to an aspect of the disclosure, the support module capable of being coupled to the rear surface of the display module by using a magnetic force without any separate coupling member may be provided.

According to an aspect of the disclosure, the support module capable of being separated from the rear surface of the display module by a push operation or a sliding operation without any separate coupling member may be provided.

According to an aspect of the disclosure, the support module detachably coupled to the stand may rotatably support the display module.

Although specific embodiments of the disclosure have been described, the disclosure is not limited to the above-described specific embodiments, and it is obvious that various modifications can be made by persons of ordinary skill in the technical art to which the disclosure belongs without deviating from the gist of the disclosure set forth in the claims.

What is claimed is:
1. A display apparatus comprising:
a display module;
a support bracket including:
a coupling groove on a rear surface of the display module,
a locking link configured to be movable from outside of the coupling groove to inside of the coupling groove, and from inside of the coupling groove to outside of the coupling groove, and
a rotating link; and
a support module including a magnet, the support module being lockable to, and unlockable from, the support bracket,
wherein the support bracket and the support module are configured so that,
the support module is insertable in the coupling groove so that a magnetic force of the magnet moves the locking link from outside of the coupling groove to inside of the coupling groove so as to contact the support module and thereby lock the support module to the support bracket, and
when the rotating link is rotated while the support module is locked to the support bracket, the rotating link moves the locking link from inside of the coupling groove to outside of the coupling groove and thereby unlocks the support module from the support bracket.
2. The display apparatus of claim 1, wherein
the locking link is configured to include a magnetic body such that the locking link moves toward the magnet by the magnetic force of the magnet.
3. The display apparatus of claim 1, wherein,
while the support module is locked to the support bracket, the support module supports the support bracket and the display module such that the display module is rotatable between a first mode in which long sides of the display module are positioned horizontally, and a second mode in which the long sides of the display module are positioned vertically.
4. The display apparatus of claim 1, wherein
the support bracket includes:
a fixing plate accommodating the locking link such that the locking link is movable between a first location at which the locking link is positioned outside of the coupling groove and a second location at which at least one portion of the locking link is positioned inside of the coupling groove; and
a rotating plate coupled to the fixing plate so as to be rotatable with respect to the fixing plate, and configured to move the locking link from the second location to the first location by rotating with respect to the fixing plate.
5. The display apparatus of claim 4, wherein
a rotating guide hole is formed in the rotating plate, and the rotating link includes:
a rotating guide protrusion inserted in the rotating guide hole and configured to rotate the rotating plate according to a rotation of the rotating link.
6. The display apparatus of claim 4, wherein
a guide hole is formed in the rotating plate, and
the locking link includes:
a guide protrusion inserted in the guide hole and configured to move inside the guide hole to guide a movement of the locking link according to a rotation of the rotating plate.
7. The display apparatus of claim 5, wherein
the support bracket includes:
a push member protruding toward a rear direction of the display module from the rear surface of the display module, and
the push member is configured to rotate the rotating link by being pushed toward a front direction of the display module.
8. The display apparatus of claim 7, wherein
the push member includes:
a first inclined surface inclined with respect to a first direction toward the front direction of the display module from behind the display module, and
a second direction being perpendicular to the first direction, and
the rotating link includes:
a second inclined surface facing the first inclined surface.
9. The display apparatus of claim 8, wherein
the first inclined surface is configured to guide the second inclined surface such that the rotating link rotates according to a movement of the push member in the first direction.
10. The display apparatus of claim 5, wherein
a sliding hole is formed in the fixing plate,
the rotating link includes:

a sliding protrusion passing through the sliding hole and protruding toward the rear direction of the display module, and the rotating link is configured to rotate according to a sliding of the sliding protrusion in the sliding hole.

11. The display apparatus of claim 1, wherein the support module includes:
   a fixing body, and
   a rotating body accommodating the magnet, and coupled to the fixing body so as to be rotatable with respect to the fixing body.

12. The display apparatus of claim 11, wherein the support module includes:
   a locking groove in which the locking link is insertable to thereby lock the support module to the support bracket.

13. The display apparatus of claim 12, wherein the fixing body is substantially in a shape of a cylinder, the rotating body is substantially in a shape of a quadrangular column, and the locking groove includes:
   a plurality of locking grooves respectively provided in four side surfaces of the rotating body.

14. The display apparatus of claim 4, wherein the fixing plate includes:
   a plate portion forming at least one portion of the rear surface of the display module.

15. The display apparatus of claim 11, further comprising:
   a stand coupled to the support module and configured to support the display module,
   wherein the stand is coupled to the fixing body of the support module, and
   the support module is locked to the support bracket by inserting the rotating body in the coupling groove, whereby the magnetic force of the magnet moves the locking link from outside of the coupling groove to inside of the coupling groove to contact the support module.

* * * * *